United States Patent [19]

Lewis et al.

[11] Patent Number: 4,891,645
[45] Date of Patent: Jan. 2, 1990

[54] DIGITAL-TO-ANALOG CONVERTER WITH ON-BOARD UNITY GAIN INVERTING AMPLIFIER

[75] Inventors: Stephen R. Lewis, Reading; Scott A. Lefton, Melrose, both of Mass.

[73] Assignee: Analog Devices Inc., Norwood, Mass.

[21] Appl. No.: 253,072

[22] Filed: Oct. 4, 1988

[51] Int. Cl.⁴ ............................................. H03M 1/78
[52] U.S. Cl. .................................. 341/154; 341/127; 341/148; 341/150
[58] Field of Search ............... 341/127, 146, 147, 148, 341/150, 154

[56] References Cited

U.S. PATENT DOCUMENTS 4,488,144 12/1984 Wollman ............................. 341/127
4,667,179 5/1987 Law et al. .......................... 341/150
4,803,461 2/1989 Yamaguchi et al. ................ 341/154

OTHER PUBLICATIONS

Engineering Staff of Analog Devices, "Analog-Digital Conversion Handbook" 3rd Edition, 1986, pp. 207–211.

Primary Examiner—William M. Shoop, Jr.
Assistant Examiner—Gary J. Romano
Attorney, Agent, or Firm—Wolf, Greenfield & Sacks

[57] ABSTRACT

The invention provides a monolithic Y-bit resistive-ladder type digital-to-analog converter (DAC) having a unity gain inverting operational amplifier as an input buffer to the resistive ladder segment of the DAC. The reference voltage is applied to the input buffer amplifier. Optional bipolar operation is provided by applying a non-inverted reference voltage to the output of the resistive ladder segment of the DAC through a scaled resistance. Analog ground current cancellation is provided by a secondary X-bit R-2R ladder (where X Y) with the non-inverted reference voltage applied to it. The secondary bit ladder is switched in parallel with the top X bits of the main ladder, thereby supplying or sinking roughly the same amount of current as the X most significant bits of the main resistive ladder, but with opposite sense. The effect on the DAC output of the resistance and temperature coefficient of the switches used in the R-2R ladder and elsewhere in the circuitry is minimized by selecting switches appropriately scaled to provide resistances whose sum effect is to cancel each other out. (Particularly, a FET switch biased permanently on is provided at the input of the unity gain inverting operational amplifier.) Since the DAC is monolithic, the switches have approximately equal temperature coefficients such that the effect of the switches is consistent at all temperatures.

10 Claims, 3 Drawing Sheets

DIGITAL-TO-ANALOG CONVERTER WITH ON-BOARD UNITY GAIN INVERTING AMPLIFIER

FIELD OF THE INVENTION

The invention relates to digital-to-analog converters. More particularly, the invention relates to four guadrant digital-to analog converters having analog ground current cancellation and capable of operation in both unipolar and bipolar modes.

BACKGROUND OF THE INVENTION

Most digital to-analog converters (DACs) today are of the R-2R type. FIG. 1 shows a simplified circuit diagram of an eight bit R-2R ladder DAC of the prior art. The switches 1 through S8 are FET switches which are controlled by an eight bit digital input word to the DAC. Each bit position in the digital word controls a respective switch to send the current through the respective legs of the circuit (i.e., the 2R resistor above the switch) either to analog ground 12, if the corresponding bit is a 0, or to the summing junction 14, if the corresponding bit is a 1. S1 is controlled by the most significant bit of the digital word while each successive switch is controlled by the next most significant bit. The summing junction 14 is held at virtual ground by the output buffer amp 16. Due to the configuration of the resistors having impedances of R and 2R, the current in each leg is one half the current in the preceding (i.e., next most significant) leg. However, since there is no resistance R in series with the resistance 2R in leg 9, the current in legs 8 and 9 are egual.

Vref, the input voltage to the R-2R ladder, is a reference voltage which provides a current I into the ladder. The R-2R configuration will split the input current I between analog ground 12 and the summing junction 14 in accordance with the switches S1-S8 and the digital input word. The buffer amplifier 16 converts the current at the summing node 14 into a voltage, $V_{out}$. $V_{out}$ is the analog output voltage corresponding to the digital input word.

As an example, if the digital input word is 10010010, the current flowing through legs 1, 4 and 7 would be directed to the summing node 14 while the current in legs 2, 3, 5, 6 and 8 would be sent to analog ground 12. If we call the current in leg 1 $I_{msb}$, then the current at the summing junction 14 will be $I_{msb} + \frac{1}{8} I_{msb} + 1/64 I_{msb}$. The remaining current, $\frac{1}{2} I_{msb} + \frac{1}{4} I_{msb} + 1/6 I_{msb} + 1/32 I_{msb} + 1/128 I_{msb}$, is sent to analog ground. The buffer amplifier 16 converts the current at summing junction 14 to a voltage at $V_{out}$. Since the buffer amplifier 16 is an inverting amplifier, $V_{out}$ will be a negative voltage if Vref is a positive voltage. In order to obtain a positive output voltage, the $V_{out}$ signal is inverted at a later stage in the signal processing of the DAC.

The R-2R ladder shown in FIG. 1 is configured to operate only in a uni-polar mode, that is, its output can only be of the opposite polarity of the applied Vref. In order to obtain four guadrant operation, i.e., allow for a positive or negative analog output voltage in response to a positive or negative digital input word using offset binary or two's-complement codes, an offset current equal and opposite to $\frac{1}{2}$ Iref is added to the summing junction 14. This causes the voltage at $V_{out}$ to be offset by exactly $\frac{1}{2}$ the full scale range of the DAC. Therefore, if $V_{out}$ in the uni-polar mode has a range of 0 to 5 volts, $V_{out}$ would have a full scale range of $\pm 2.5$ volts in the bi-polar mode. The offset reference current may be provided by a separate offset reference. More usually, it is derived from the DAC's basic Vref signal in order to minimize drift of the output zero with temperature.

Errors are introduced into the analog output of a DAC if the analog ground 12 seen by the R-2R ladder drifts from the true ground seen by the related circuit components (i.e., the chip ground pin connector). Ideally, the conductor which leads from the switch terminals to ground and the ground line itself are perfect conductors and offer no electrical resistance to the circuit. Unfortunately, however, the conductor in the DAC does provide a small but non-negligible resistance to the circuit. This resistance causes the voltage at the switch terminals to drift from true ground to some offset value, thereby offsetting all currents to both analog ground 12 and the summing junction 14 and causing inaccurate readings. Analog ground drift, as it is called, which is about $\frac{1}{2}$ or more of the amplitude of the least significant bit (as determined by Vref and the number of bits of resolution) causes inaccurate operation of the DAC and is unacceptable. Unfortunately, errors of greater than $\frac{1}{2}$ lsb are easily accumulated, particularly in monolithic chips carrying a multiplicity of DACs. In such chips, the total amount of conductor resistance between the pin which is to be connected to analog ground and the actual switches in the DAC can be quite significant and particularly bothersome in higher accuracy DACs.

For instance, a 12-bit DAC having a reference voltage of 10 volts would have a least significant bit value of 2.5 mV. An analog ground drift of more than 1.25 mV ($\frac{1}{2}$lsb) would cause an error in the analog output of the DAC. If the ground wire offers a resistance of 1 ohm to the circuit, then an analog ground current of just 1.25 mA would cause an unacceptable analog ground drift of 1.25 mV.

Another error introduced into the analog output in prior art DACs is caused by the temperature dependence of the FET switches used in the R 2R ladder as well as additional FET switches that might be included for such purposes a selecting uni polar or bi polar operation or selecting a full scale range for the DAC. The resistance offered to the circuit by the FET switches drifts with temperature, thereby causing the analog output also to drift with temperature. The amount by which the resistance of the FET switches drifts with temperature is defined by the "temperature coefficient", or TC, of the switch.

Therefore, it is an object of the present invention to provide a monolithic digital-to-analog converter that is substantially immune to analog output drift due to the TC of the FET switches in the circuitry.

It is a further object of the present invention to provide a monolithic digital-to-analog converter that substantially eliminates the effect of analog ground current on the output analog voltage.

It is yet another object of the present invention to provide a monolithic digital to-analog converter capable of being selectively programmed to operate in either uni-polar or bi-polar modes.

Additionally, it is a further object of the present invention to provide an improved monolithic digital-to-analog converter.

SUMMARY OF THE INVENTION

The present invention provides a monolithic resistive ladder type digital to-analog converter capable of four quadrant operation, and having analog ground current cancellation, optional unipolar or bipolar operation, optional gain selection and temperature coefficient cancellation. An on-board unity gain inverting amplifier is provided in the circuit between the input reference voltage and the resistive ladder array. This provides a positive output voltage from the DAC in response to a positive reference voltage. Further, optional bipolar operation may be initiated by closing a switch which couples the reference voltage to the inverting input of the output buffer amp of the DAC through a resistance scaled to offset the current at the inverting input of the output buffer amplifier by one-half the reference current.

Analog ground voltage drift is substantially cancelled by providing to the analog ground connection point a current substantially equal in magnitude but opposite in polarity to the current supplied to analog ground by the resistive ladder array. This is accomplished by providing a small untrimmed four bit R-2R ladder with an uninverted reference input applied to it. It is switched in parallel with the four most significant bits of the main R-2R ladder, thereby supplying or sinking approximately the same amount of current as the four most significant bits of the mainladder array, but with opposite polarity. This cancels a substantial portion of the ground current, thereby substantially reducing the effect of impedance in the analog ground current line on the output voltage and the switch voltages.

A mode select FET switch is provided to selectively switch in the reference voltage through an appropriately scaled resistor to the inverting input of the output buffer amplifier, thereby allowing selection between unipolar operation and bipolar operation. Two further FET switches, the gain select switches, are provided for switching one of two possible resistance values across the output buffer amplifier in order to provide two different gain possibilities. In the preferred embodiment, the resistance values are scaled so as to provide full scale output voltage ranges of 10 volts or 20 volts in response to an input reference voltage of 10 volts.

To counter the effect of the temperature coefficient of the FET switches used in the R-2R ladder without using excessive semiconductor area, the gain select switches are appropriately scaled to the minimum size necessary to maintain linearity in the output of the DAC. Further, the mode select switch is ratiometrically scaled in relation to the gain select switches to counter any temperature drift in the gain select switches and maintain linearity. Since the gain select switches and mode select switch are smaller than the DAC ladder switches, the DAC ladder switch resistance does not track over temperature equally with the gain and mode select switch resistances. Therefore, the temperature coefficient of the DAC switches causes the output voltage to rise with temperature, thus degrading the accuracy of the DAC output. To compensate for this, a fourth switch is added at the input of the unity gain inverting amplifier. The fourth switch is scaled to have a resistance that will decrease the output of the unity gain inverting amplifier with rising temperature at a rate sufficient to cancel substantially the effect of the increasing voltage at the resistive ladder output and to cause the system output to stay nominally constant with temperature variation.

The invention will be more fully understood from the detailed description below, which should be read in conjunction with the accompanying drawing. This description is presented by way of example only, the invention being defined only by the claims appended to the end of the description.

DETAILED DESCRIPTION OF A PREFERRED EMBODIMENT

Figure 1:
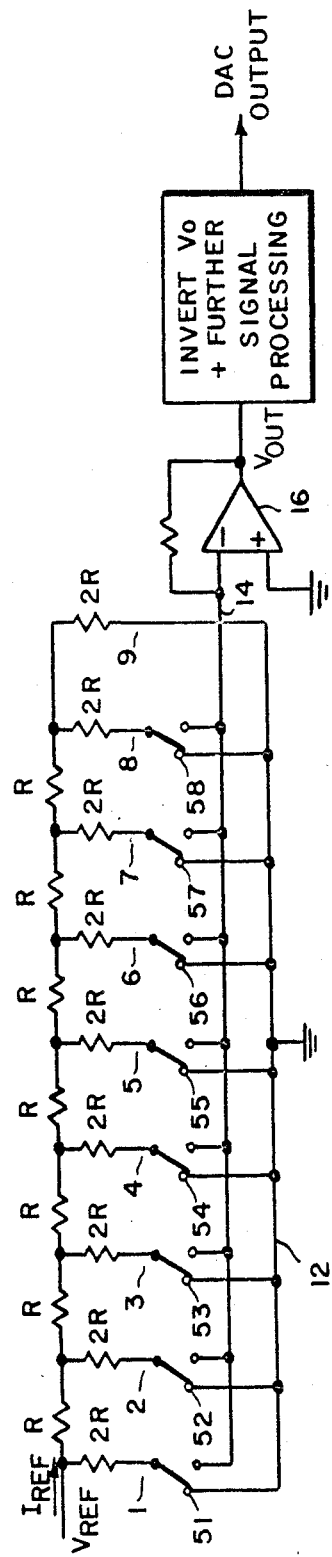
FIG. 1 shows an eight bit digital-to-analog converter of the prior art.
Figure 2:
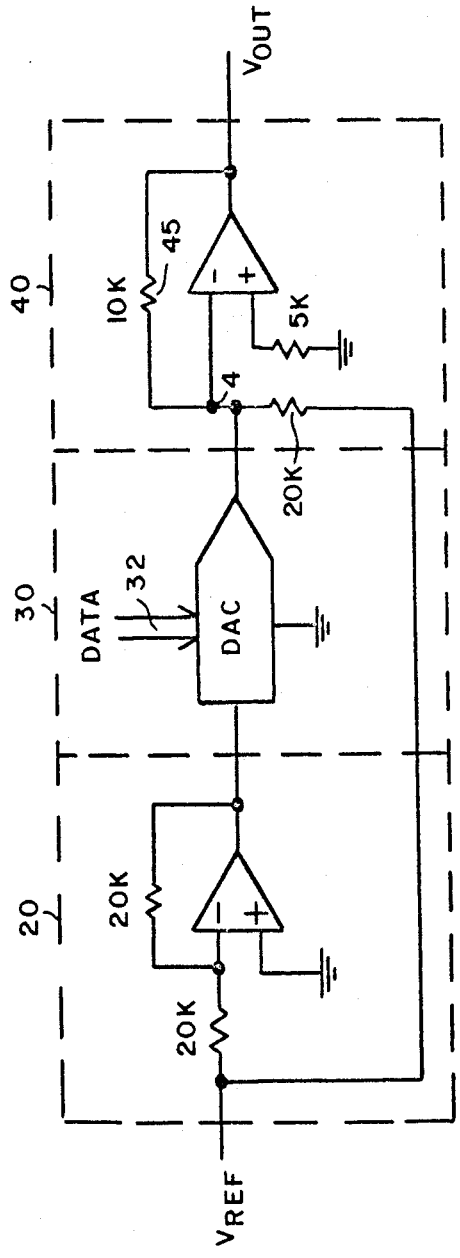
FIG. 2 shows a generalized circuit diagram of the digital-to-analog converter of the present invention.

FIG. 2 shows the digital-to-analog converter of the present invention as comprising three main parts, input buffer amplifier 20, a resistive ladder portion with a digital input 30 and an inverting output buffer amplifier 40. This figure basically shows the addition of an input buffer amplifier 20 to the R-2R ladder portion 30 and output buffer amplifier 40 of the prior art. In the simplified form shown in FIG. 2, Vref is supplied at the input of the inverting input amplifier, which has unity gain, so that the ladder portion 30 receives an inverted Vref at its input. Vref is further supplied to the input of the inverting output buffer amplifier through a resistance of 20K ohms. This connection injects ½ the full scale current into summing junction 4, thereby providing bipolar operation. If the digital word 32 is provided in either two's complement or offset binary form, full four-quadrant operation is obtained.

The addition of the input inverting buffer amplifier provides an extremely simple and effective manner of eliminating the problem of excessive analog ground current causing a non zero voltage to appear at the "ground" terminal of the FET switches in the resistive ladder segment. Analog ground drift due to excessive current at the ground node causes both offset drift and full scale drift as well as nonlinearity in the output of the resistive ladder segment of the DAC.

The effect of analog ground drift can be eliminated by causing an additional current to flow to the analog ground connection point that is substantially equal but opposite to the current caused to flow into analog ground by the resistive ladder. This causes the current in the analog ground to be substantially zero, such that virtually no voltage appears at the ground terminal of the switches in the resistive ladder. The addition of the inverting input buffer amplifier to the DAC provides an extremely simple and efficient manner of providing such a current to analog ground.

Figure 3:
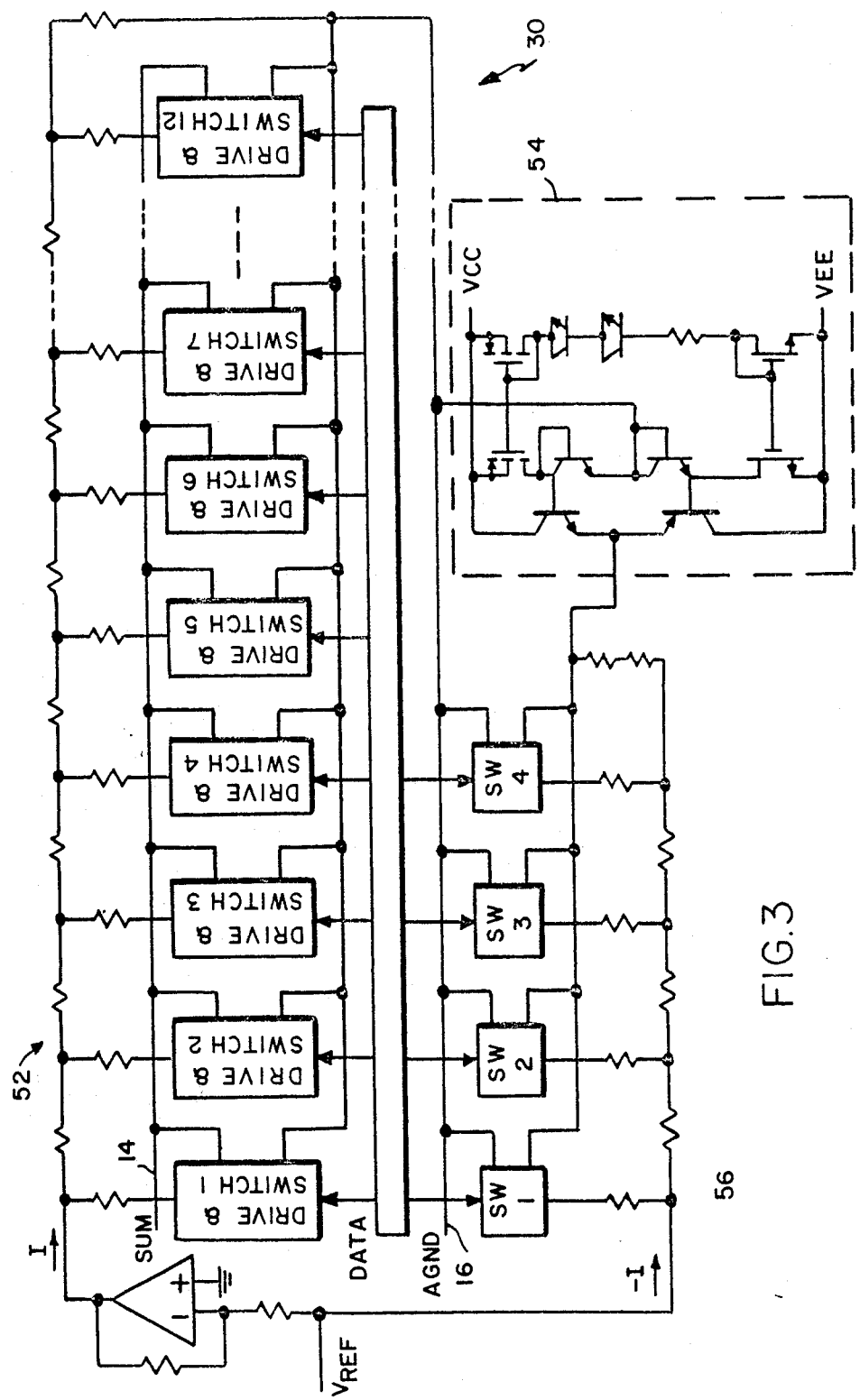
FIG. 3 shows a detailed circuit diagram of the R-2R ladder of the present invention and the ground current cancelling R-2R ladder.

Referring to FIG. 3, there is generally shown a 12 bit main resistive ladder 52. The summing node is shown at 14, while analog ground is shown at 16. As discussed above, an inverted Vref signal is applied to the input of the main resistive ladder via the inverting input buffer amplifier. Analog ground current cancellation is accomplished by providing a small untrimmed four-bit R-2R ladder 56 with Vref supplied directly to its input, i.e. uninverted. The four legs of the current cancelling R-2R ladder 56 are switched in parallel with the four most significant bits of the main R-2R ladder 52, thereby supplying (or sinking) current with the opposite sense of the four most significant bits of the main ladder. The analog ground terminals of the switches in the current cancelling ladder are connected to analog ground 16 just as the main ladder is. The "summing node" terminals of the switches are coupled to circuit 54, which drives it to a ground equivalent without adding the current back to ground. This circuit may not be needed if a separate path to an external ground is available. It should be apparent that the current cancelling resistive ladder will supply to analog ground a current which is roughly egual but opposite to the current supplied to analog ground by the four most significant bits of the main resistive ladder. In fact, as the following equations illustrate, the current canceling ladder cancels over 90% of the analog ground current even in the worst case situation (i.e. the digital word which will cause the current supplied to analog ground by the current cancelling ladder to be as different from the current supplied to analog ground by the main ladder). This occurs when the DAC is set to all zeros and all of the DAC current is switched to ground. Assuming Vref supplies a current I to the input of the R-2R main ladder, the following equations hold true:

The current supplied to analog ground by the main ladder is given by the equation:

$$\text{Analog Ground Current} = \frac{4095}{4096} I = 0.9997588 \, I$$

The current supplied to analog ground by the current cancelling ladder is given by the following equation:

$$\text{Opposite analog ground current} = -\frac{15}{16} I = -0.9375 \, I$$

As shown by the equation below, this cancels over 90% of the current in analog ground.

$$.9375/.9997588 = .938 = 93.8\%$$

The cost of providing the current cancelling ladder is low since the resistances in the R-2R ladder need not be trimmed to precision values. Precision trimming is unnecessary since small analog ground currents remaining after substantial current cancellation generally will not be large enough to effect the integrity of the analog output voltage. If desired, however, precision trimming can be done. Also, the current cancelling ladder may have more or less than four legs depending on the accuracy desired.

The addition of the unity gain inverting amplifier also eliminates the need for additional circuitry subsequent to the resistive ladder stage of the DAC for inverting the output. The unity gain inverting amplifier inverts the Vref applied to the ladder portion of the DAC such that a positive voltage output is obtained from the DAC in response to a positive Vref with n need for inverting circuitry in later stages of the system.

Figure 4:
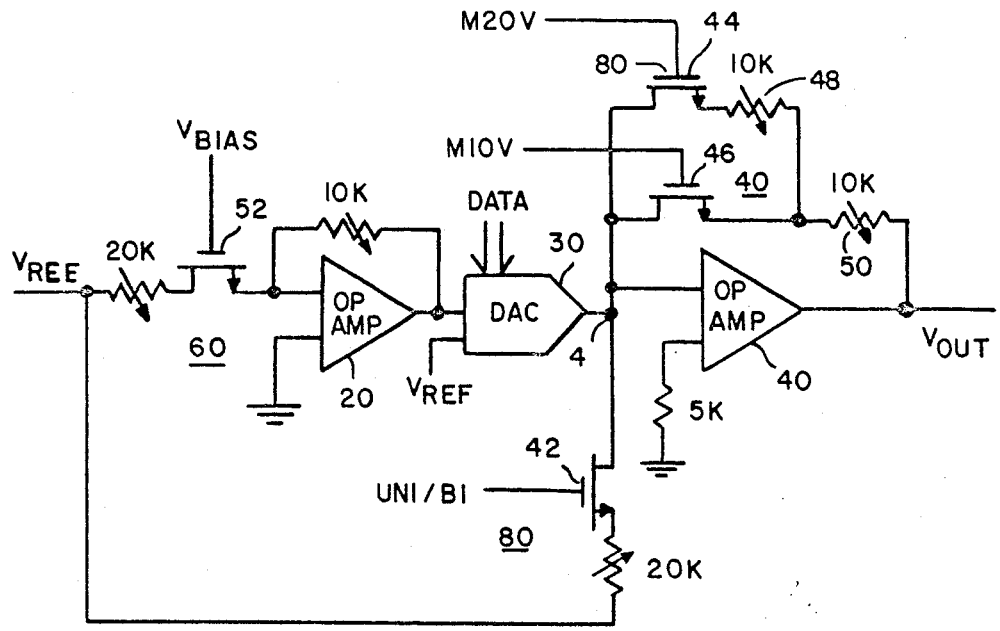
FIG. 4 shows a second more detailed circuit diagram of the digital-to-analog converter of the present invention.

FIG. 4 is a more detailed illustration of the DAC of the present invention. Uni/bi switch 42 is a FET switch which, when closed, provides Vref through a 20K ohm resistor to the input of the output buffer amplifier 40, thereby injecting a current into node 44 that is egual to $-\frac{1}{2}$ of the DAC full scale current. When switch 42 is closed, the DAC operates in the bipolar mode. When switch 42 is open, the circuit operates in a unipolar mode. Switches 44 and 46 are also FET switches and are used to select the desired gain of the output buffer amplifier 40. The switches 44 and 46 are switched alternately so that only one can be closed at any given time. When switch 44 is closed, 10K resistor 48 and 10K resistor 50 are coupled in series to provide a total feedback resistance of 20K ohms across the operational amplifier 40. Since the resistive ladder provides a total resistance of approximately 10K ohms at the input of the operational amplifier 40, this mode provides a gain of two, so that the maximum range of $V_{out}$ is twice Vref. When switch 46 is closed, only 10K resistor 50 is coupled across operational amplifier 40, thereby providing unity gain.

Figure 5:
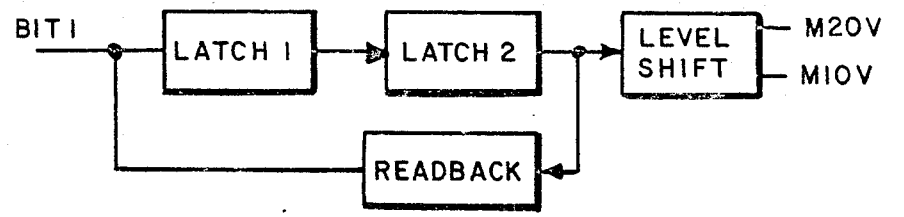
FIG. 5 shows the mode select register for the digital-to analog converter of the present invention.
Figure 5:
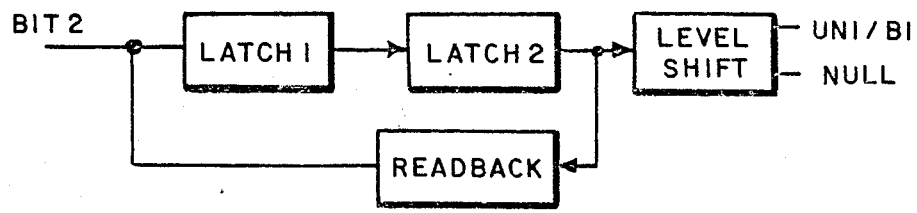

The combination of switches 42, 44 and 46 provides four possible modes of operation for the DAC. Assuming Vref is 10 volts, the options are unipolar with a range of 0 to 10 volts, unipolar with a range of 0 to 20 volts, bipolar with a range of ±5 volts and bipolar with a range of ±10 volts. In the preferred embodiment, the bit pattern to select these options is stored in a two-rank register, allowing the mode to be updated with a single instruction. The outputs of this register are shown in FIG. 5 as M20V, M10V and UNI/BI. As stated above, the M20V and M10V lines are alternately switched, such that one is always on and one is always off. The third line, UNI/BI, controls the switch that adds in the $-\frac{1}{2}$ Iref voltage as an offset to the output of the resistive ladder section 30. The first two switches control the feedback loop around the output operational amplifier as shown in FIG. 4, thus regulating gain. The UNI/BI switch injects Iref, pulling the output down by $\frac{1}{2}$ Iref in the M10V mode or Iref in the M20V mode. Although there are technically four mode options in the circuit of FIGS. 4 and 5, the unipolar option with a range of 20 volts is not of general use since the full scale voltage indicated by it can easily exceed the output range of the operational amplifier 40. It does, however, serve to magnify the smaller output codes.

Each of the FET switches 42, 44 and 46 is selected so as to provide a resistance relative to each of the other switches in the circuit, such that the adverse effect of each switch on the gain, and therefore the accuracy, of the system substantially cancels each other out. The switches are scaled to each other in direct proportion to the resistances that they are switching, i.e., switch 46 switches in resistor 50 which is 10k, and therefore switch 46 has $\frac{1}{2}$ the on resistance of switches 42 and 44, both of which switch in 20k. The FET switches have non zero temperature coefficients and therefore their resistances drift with temperature. However, since, in a monolithically constructed circuit, the switches will all have approximately the same temperature characteristics, the switch resistances substantially cancel each other out regardless of the temperature of the circuit.

The gain select switches 44 and 46 are scaled to the minimum size necessary to prevent any non linear properties to adversely affect the linearity of the DAC transfer function. In one possible embodiment, each of the gain select switches 44 and 46 is ratiometrically scaled to provide an on resistance egual to the DAC switches that switch an equivalent value of resistance in the R-2R ladder. Providing switches with such low resistances, however, is not preferred since this would necessitate very large silicon areas for each switch. This would add parasitic capacitance and leakage currents to the DAC summing junction 4, in turn causing frequency instability and temperature drift. In at least one preferred embodiment, the gain select switches 44 and 46 are chosen to have the minimum size necessary to maintain linearity of the DAC transfer function. In the embodiment of FIG. 4, it has been found that the gain select switch 46 may be scaled to approximately four times the total on resistance (i.e., ¼ the size) of the equivalent DAC switches. Switch 44 is then scaled to be twice the on resistance of switch 46 due to the fact that it switches twice the size resistor as switch 46 (20k as opposed to 10K). The mode select switch 42 is then scaled equal to that of switch 44 since both of them switch 20K resistances. Since switches 42, 44 and 46 are all ratiometrically correct, their temperature coefficients track correctly so that the total gain of the system when the system operation involves only those switches, i.e., when the DAC is switched off and the device is in bipolar mode, has virtually no temperature drift.

However, when the effect of the DAC ladder is non-zero, the circuit output drifts with temperature because the DAC switches are of significantly lower on resistance than switches 42, 44 and 46. Because of this effect, the gain of the output amplifier changes over temperature at a faster rate than the output current of the DAC. Thus, for example as the temperature increases, the on resistance of the DAC switches might rise approximately 5 ohms while the series on resistance of the gain select switches might change 20 ohms. This mismatch causes the gain of the system to increase over temperature unless some form of compensation is introduced A bias switch 52 is added at the inverting input of the input amplifier to effect this compensation. By inserting an appropriately scaled temperature-dependent resistor that has the same temperature characteristics as the switch resistors (i.e., FET switch 52), in the gain path of the circuit, temperature drift is substantially eliminated from the DAC.

The following example illustrates the effect of the switches in preventing errors in the output voltage $V_{out}$. Taking the DAC 30 full scale resistance to be 10,010 ohms (i.e. 10, 000 ohms plus 10 ohms switch resistance at full scale), the following switch resistance values are chosen for the switches;
  gain select switch 44 (20 volt span)=80 ohms
  gain select switch 46 (10 volt span)=40 ohms
  mode select switch 42=80 ohms
  bias switch 52=60 ohms These resistances are precisely set by laser trimming of the resistors. The gain of the circuit having the resistance values given above in unipolar ±5 volt mode in response to a full scale digital word is given by the following equation:

$$V_{out} = Vref\left(\frac{20000}{20060}\right) \times \left(\frac{10040}{10010}\right) = .9999969\ Vref \approx Vref$$

If switch 52 is eliminated from the circuit and all other switch resistances are assumed to be the same as shown in FIG. 4, then the equation for the unipolar ±5 volt mode would have been as follows:

$$V_{out} = Vref\left(\frac{20000}{20000}\right) \times \left(\frac{10040}{10010}\right) = 1.002997\ Vref$$

As is apparent from the above equations, the inclusion of the biasing switch 52 greatly increases the accuracy of the DAC.

The following hold true for $V_{out}$ in the bipolar ±5 volt mode with and without switch 52, respectively:

$$V_{out} = Vref\left(\frac{20000}{20060}\right) \times \left(\frac{10040}{10010}\right) -$$

$$Vref\left(\frac{10040}{20080}\right) = .4999969\ Vref$$

$$V_{out} = Vref\left(\frac{20000}{20000}\right) \times \left(\frac{10040}{10010}\right) -$$

$$Vref\left(\frac{10040}{20080}\right) = 502997\ Vref$$

In the bipolar ±10 volt mode the following equations hold true for the circuit in FIG. 4 with and without the bias switch 52, respectively:

$$V_{out} = Vref\left(\frac{20000}{20060}\right) \times \left(\frac{20040}{10010}\right) -$$

$$Vref\left(\frac{20080}{20080}\right) = .9999938\ Vref$$

$$V_{out} = Vref\left(\frac{20000}{20000}\right) \times \left(\frac{20080}{10010}\right) -$$

$$Vref\left(\frac{20080}{20080}\right) = 1.005994\ Vref$$

As temperature varies, the switch resistance will also vary. However, since the DAC is of monolithic construction, all switch resistances will vary at approximately the same rate and therefore the ratio of $V_{out}$ to Vref will not vary significantly from the values shown in the above equations. The bias switch 52 is ratiometrically scaled to provide an on resistance that varies over temperature so as to cause the gain of the input amplifer to decrease with rising temperature at nominally the same rate that the mismatch between the DAC switch resistance and the gain/mode switch resistances would cause $V_{out}$ to increase with rising temperature. If switch 52 was not included, the again could be trimmed accurately at one temperature, but would accumulate an error over temperature drift of the approximate magnitude shown in the above calculations with switch 52 removed.

Having thus described one particular embodiment, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is intended by way of example only, and not to be limiting. The invention is limited only as defined in the following claims and equivalents thereto.

What is claimed is:

1. A digital-to analog converter comprising:
   a first inverting operational amplifier having an input coupled to receive a reference voltage and an output;
   a resistive ladder array for converting digital words to corresponding analog currents, having an input coupled to said first inverting amplifier and an output coupled to a summing junction, said resistive ladder array being of the type that divides a current supplied at its input, in accordance with a digital word, and transmits a first portion of said input current to the output of said resistive ladder array and a second portion to an analog ground connection;
   a second inverting operational amplifier having an input and an output, the input being coupled to the output of said resistive ladder at said summing junction.

2. A digital to-analog converter as set forth in claim 1 wherein said resistive ladder array comprises a plurality of resistive leg portions, each leg corresponding to a bit of said digital word and carrying a portion of said current corresponding to the relative weight of the corresponding bit, each of said legs having switch means controlled by said corresponding bit to provide its current portion to analog ground, if the corresponding bit is in a first state, and to the summing junction, if the corresponding bit is in a second state.

3. A digital to-analog converter as set forth in claim 2 comprising:
   a second resistive ladder array having an input coupled to said reference voltage source, said second resistive ladder array having a plurality of successive resistive leg portions, but no more than said first resistive ladder, each leg carrying a portion of current which is twice that of the preceeding leg and each of said legs having a switch means controlled by a digital input bit, to said switch means causing the current in the associated leg to flow to said analog ground, if the corresponding bit is a zero, and to a virtual ground which is separate from the analog ground, if the corresponding bit is a one, said second resistive ladder being switched in parallel with the most significant bits of said digital word.

4. A digital to-analog converter as set forth in claim 3 further comprising a mode select switch which couples said reference voltage to said summing junction when in a first state and which creates an open circuit when in a second state so as to allow for optional bipolar operation when in the first state.

5. A digital-to analog converter as set forth in claim 4 further comprising:
   a plurality of gain select switches for alternately coupling the output of said second inverting operational amplifier to the inverting input of said second inverting amplifier through a plurality of resistances, so as to provide a plurality of possible gain factors for said second amplifier; and
   a biasing switch between said reference voltage source and said first inverting amplifier, said switch being biased permanently in a closed position.

6. A digital to-analog converter as set forth in claim 5 wherein said plurality of gain select switches comprises first and second switches.

7. A digital to analog converter as set forth in claim 6 wherein the mode select, gain select and biasing switches are FET switches.

8. A digital to analog converter as set forth in claim 7 wherein said mode select switch, biasing switch, ladder switch means and said first and second gain select switches each have a resistance and temperature coefficient relative to the other switches such that the net effect of the resistance and temperature coefficients of the switches on the output of the digital to analog converter is zero.

9. A digital to-analog converter as set forth in claim 8 wherein said digital-to-analog converter is monolithic whereby all the switches have approximately equal temperature coefficients.

10. A digital-to-analog converter as set forth in claim 9 the first resistive ladder has three times the number of legs as the second resistive ladder.

* * * * *